United States Patent [19]

Horiguchi

[11] Patent Number: 4,641,280
[45] Date of Patent: Feb. 3, 1987

[54] HIGH-DENSITY SEMICONDUCTOR MEMORY DEVICE WITH CHARGE-COUPLING MEMORY CELLS

[75] Inventor: Fumio Horiguchi, Tokyo, Japan

[73] Assignee: Kabushiki Kaisha Toshiba, Kawasaki, Japan

[21] Appl. No.: 645,558

[22] Filed: Aug. 30, 1984

[30] Foreign Application Priority Data

Sep. 9, 1983 [JP] Japan .................................. 58-165902

[51] Int. Cl.⁴ ........................ G11C 11/40; G11C 13/00
[52] U.S. Cl. .................................... 365/183; 365/195; 365/218
[58] Field of Search ............... 365/183, 195, 196, 174, 365/218

[56] References Cited

U.S. PATENT DOCUMENTS 4,435,790 3/1984 Tickle et al. ........................ 365/174

OTHER PUBLICATIONS

K. Terada et al, "A New VLSI Memory Cell Using Capacitance Coupling", IEDM '82 Tech. Dig., pp. 624–627.

Primary Examiner—Terrell W. Fears
Attorney, Agent, or Firm—Oblon, Fisher, Spivak, McClelland & Maier

[57] ABSTRACT

A high-density semiconductor memory with charge-coupling memory cells is disclosed. Each CC cell includes three field effect transistors and one capacitor, which are integrated in a small area by sharing their nodes with one another. A P+ type semiconductor layer of high-impurity concentration is formed in a shallow N type semiconductive layer and is electrically floating to function as the data storage capacitor. The potential corresponding to the data storage in the above P+ layer controls the readout current flowing through the N layer.

9 Claims, 10 Drawing Figures

F.I.G. 1

F I G. 2
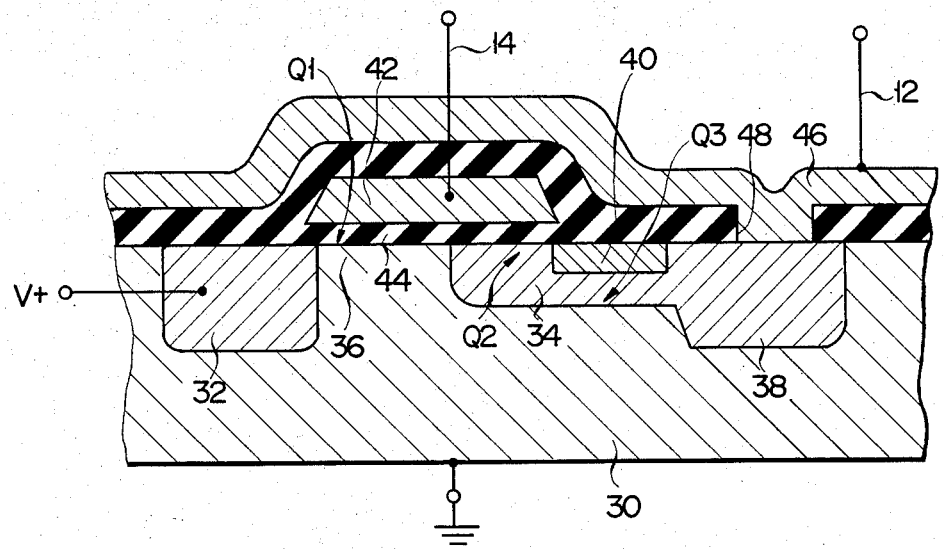
F I G. 3
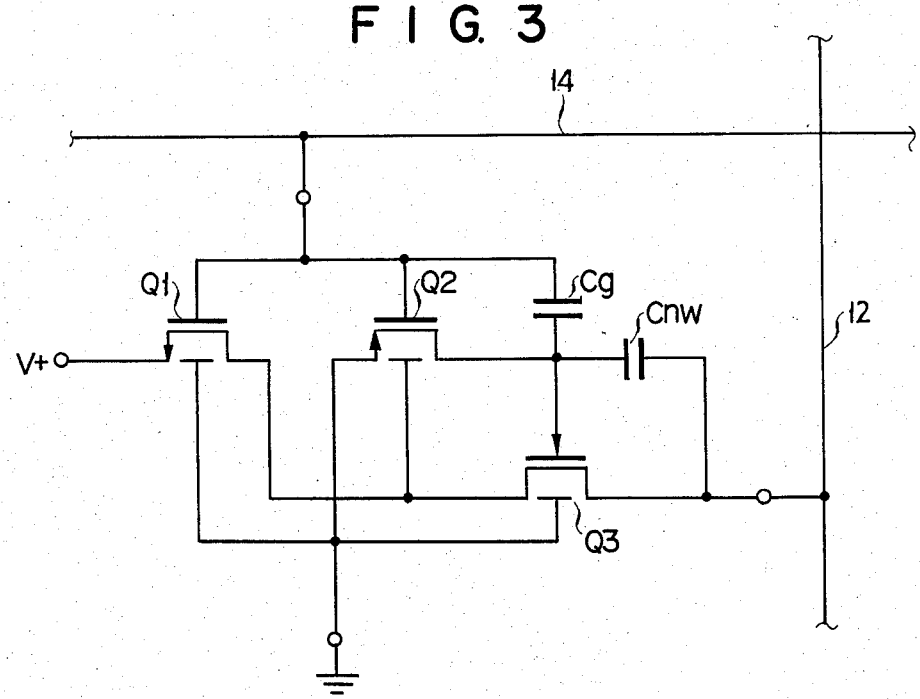

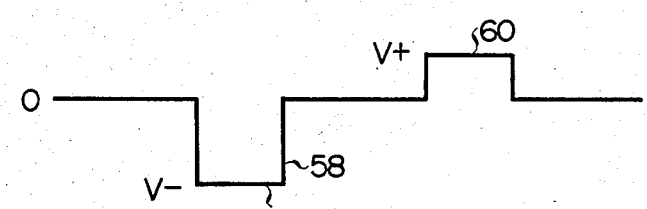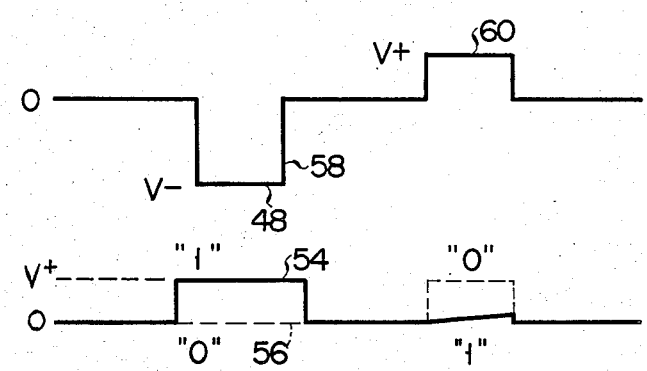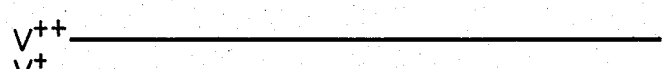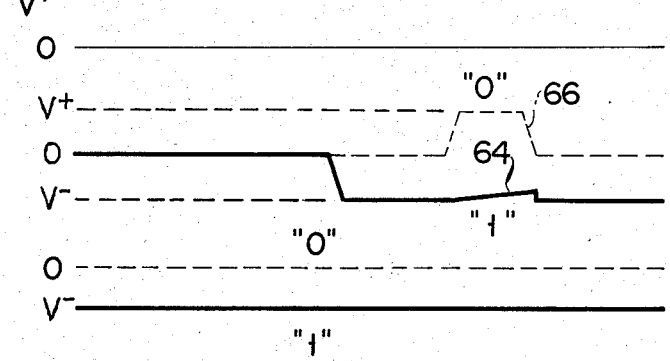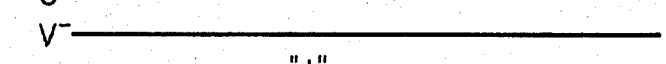
FIG. 4A
FIG. 4B
FIG. 4C
FIG. 4D
FIG. 4E

HIGH-DENSITY SEMICONDUCTOR MEMORY DEVICE WITH CHARGE-COUPLING MEMORY CELLS

BACKGROUND OF THE INVENTION

The present invention relates in general to a semiconductor memory device, and in more particular, to a high-density semiconductor memory device having memory cells using capacitance coupling.

The high integration for producing a semiconductor memory device is one of the important technical subjects which are constantly being pursued to increase the capacity of the memory. In the existing circumstances, a dynamic RAM (random access memory) is known as one of the semiconductor memory devices with the highest integration. The dynamic RAM includes a plurality of cells each of which consists of a single MOS-FET and a single MOS capacitor. However, in the future, it is obvious that a demand for the highly integrated semiconductor memory device as a VLSI memory of the next generation will further increase. It cannot be expected that this kind of demand will be completely or sufficiently satisfied by the semiconductor memory device having the existing structure. This is because in the semiconductor memory device to which the conventional memory structure has been applied as is, the area of each memory cell is decreased in order to realize high integration; the capacitance of the capacitor included in one cell is decreased in its dependence; the amount of charge storage per cell is reduced; and as a consequence, data cannot be sufficiently stored. In other words, according to the technical approach such as a simple reduction in the area of the existing memory cell structure, the degree of integration of the semiconductor memory device is limited, and so it is impossible to attain a highly integrated semiconductor memory device that is satisfactory.

In place of the conventional semiconductor memory device of the charge storage type, a new semiconductor memory device having memory cells of the current readout type has been recently reported. A typical semiconductor memory device of this kind is fully described in K. Terada et al, "A New VLSI Memory Cell Using Capacitance Coupling," IDEM 82 Tech. Dig., 1982, pp 624 –627. However, according to the semiconductor memory device having memory cells using capacitance coupling, in the case of rewriting data in an arbitrary memory cell, a discharge may occur in the other memory cells connected to the common word line (which is also used for the memory cell). This causes the drawback that the contents of the other memory cells can be erased. Therefore, in a semiconductor memory device of the current readout type, in the case of rewriting data in the arbitrary memory cells, it is necessary to perform the troublesome operations such that the data stored in the other memory cells connected to the common word line (which is also used for the arbitary memory cell) be once read out and then transferred to the external memory which has been preliminarily prepared, before they are again rewritten into the corresponding memory cells. This procedure adversely affects (1) the high-speed operation and (2) the conservation of electric power consumed by the semiconductor memory device.

SUMMARY OF THE INVENTION

It is therefore an object of the present invention to provide a new and improved semiconductor memory device having memory cells of the current readout type which are formed with a high degree of integration and in which the operating speed is improved.

It is another object of the present invention to provide a new and improved semiconductor memory device having memory cells of the current readout type which are formed with a high degree of integration and in which the operating speed is improved and the electric power consumption is reduced.

According to a semiconductor memory device of the present invention, charge-coupling memory cells are arranged in a matrix over a substrate having a first conductivity. The charge-coupling memory cells are respectively connected to word lines and bit lines which cross substantially perpendicularly with each other. Each charge-coupling memory cell comprises: (i) an electrically floating layer which capacitively stores digital data supplied from the corresponding bit line in the data writing mode, (ii) a first field effect transistor of a second channel conductivity type to which a first voltage at a fixed level is always supplied to its source, (iii) a second field effect transistor of the first channel conductivity type which commonly uses the electrically floating layer as its drain, and (iv) a junction type field effect transistor of the first channel conductivity type which commonly uses the electrically floating layer as its drain and which performs the switching operation in accordance with the data storage in the electrically floating layer in the data reading mode. Therefore, when the transistor is made conductive, it transmits the first voltage of the first field effect transistor to the corresponding bit line. The word line select decoder unit is formed over the substrate and is connected to the word lines connected to the charge-coupling memory cells. In the data writing mode, this word line select decoder unit: (i) designates the one word line connected to the cell to which data is written, (2) applies a second voltage to make the first field effect transistor included in this selected cell conductive, and (3) allows the carriers corresponding to the data content of the electrically floating layer included in this selected cell to flow out to the substrate through the second transistor which is conductive as mentioned above. Thus, after the data content of the electrically floating layer is cleared, digital data which is newly supplied from the corresponding bit line is stored in the above selected cell. The bit line select decoder unit is connected to the bit lines connected to the charge-coupling memory cell. This bit line select decoder unit applies a third voltage such as to forcedly make the first field effect transistors, included in the nonselected cells connected to the same word line as that of the selected cell, nonconductive in the data writing mode. Due to this, the data contents of electrically floating layers included in these nonselected cells are prevented from being cleared. Therefore, it is unnecessary to perform the troublesome operations such as having to temporarily store the data contents of the above nonselected cells in the external memory and having to rewrite the data after it is written in the selected cell. This fact contributes to the high speed and low power consumption of the data writing operation.

BRIEF DESCRIPTION OF THE DRAWINGS

The present invention is best understood by reference to the accompanying drawings, in which:

FIG. 2 is a diagram showing the cross-sectional structure of a single charge-coupling cell or CC cell of the semiconductor memory of FIG. 1;

FIG. 3 is a circuit diagram illustrating an electrical equivalent circuit configuration of the CC cell of FIG. 2;

FIGS. 4A to 4E are diagrams showing the waveforms of the voltage signals which are generated in or applied to the main part of the CC cell in the data writing mode and data reading mode;

DETAILED DESCRIPTION OF THE PREFERRED EMBODIMENT

Figure 1:
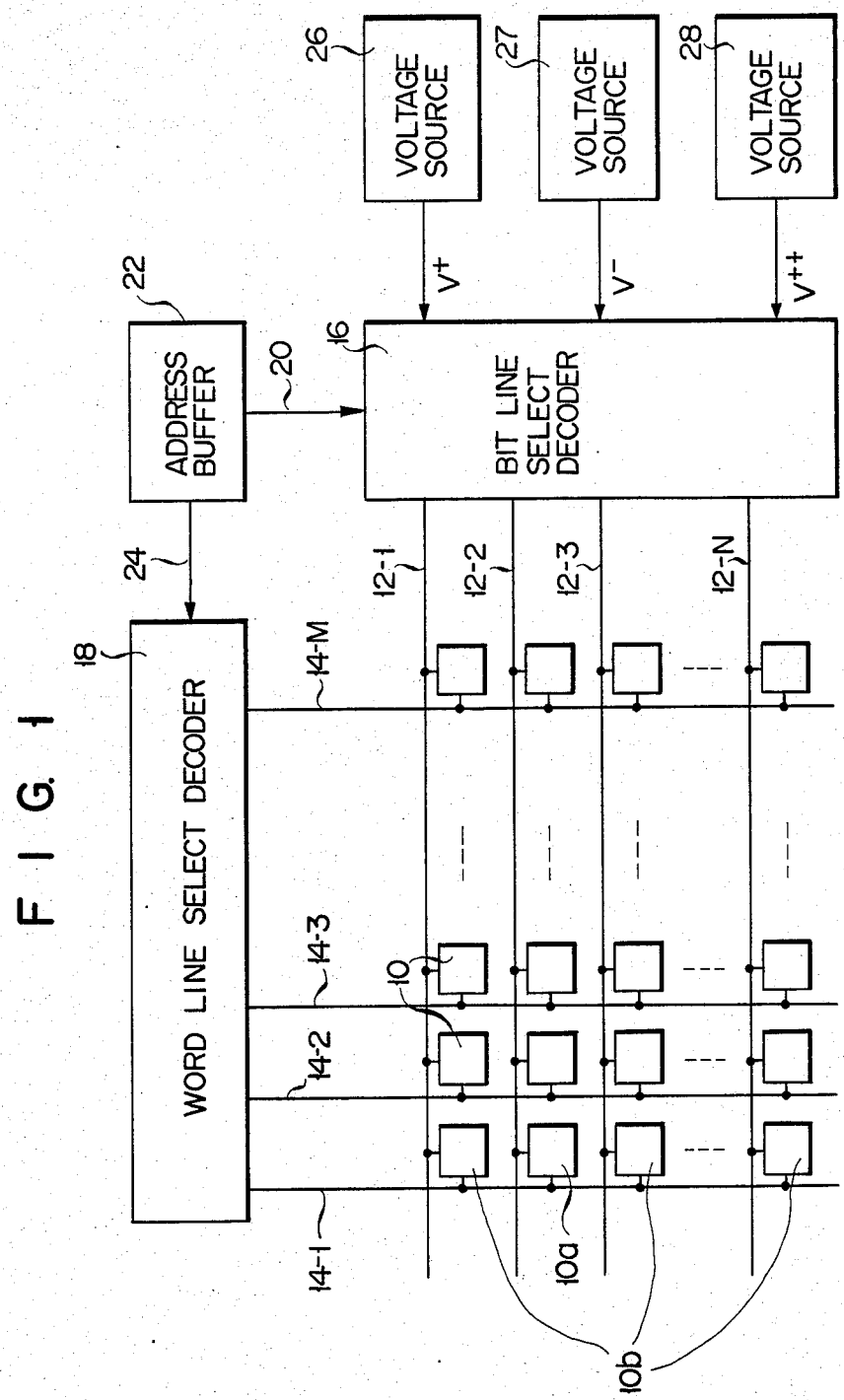
FIG. 1 is a block diagram showing the overall configuration of a high-density semiconductor memory in accordance with one embodiment of the present invention.

FIG. 1 shows a high-density (VLSI) semiconductor memory device having its memory cells formed using capacitance coupling, according to one preferred embodiment of the present invention. Memory cells are arranged like a matrix on a semiconductive substrate 30 which will be shown later by FIG. 2. Cell arrays which are aligned in the row direction are respectively connected to bit lines 12-1, 12-2, 12-3 . . . 12-N (N: positive integer). Cell arrays which are aligned in the column direction are respectively connected to word lines 14-1, 14-2, 14-3 . . . 14-M (M: positive integer). The bit lines 12 are connected to a first decoder unit 16, while the word lines 14 are connected to a second decoder unit 18. In response to a bit select signal 20 which is supplied from an address buffer 22 formed on the same substrate in correspondence to the designation from the outside, the first decoder 16 selects an arbitrary line which is used for data erasure or data writing from among the bit lines 12. On the other hand, in response to a word select signal 24 which is supplied from the address buffer 22 in correspondence to the designation from the outside, the second decoder 18 selects an arbitrary line which is used for data erasure or data writing from among the word lines 14.

Voltage sources 26, 27 and 28 are fundamentally connected to the bit line select decoder 16. The first voltage source 26 supplies a first positive voltage $V+$, for example, 5V to the bit select decoder 16. The second voltage source 27 supplies a negative voltage $V-$, for instance, $-5V$ to the bit select decoder 16. The third voltage source 28 supplies a second positive voltage $V++$, e.g., 10V to the bit select decoder 16. The voltage $V++$ is used to prevent the data in the nonselected cells from being erased upon data writing.

The structure of one memory cell is illustrated in FIG. 2. Each cell of the memory cells 10 is constituted by what is called the "capacitance coupling cell" or "CC cell" having the cell configuration of the current writing type. Each CC cell consists of [1] a capacitor Cnw and [2] three transistors Q1, Q2 and Q3 such as an N-channel MOSFET (Metal Oxide Semiconductor Field Effect Transistor) Q1, a P-channel MOSFET Q2, and an N-channel JFET (Junction FET) Q3. The electrical equivalent circuit of one CC cell consisting of these three FETs Q1, Q2 and Q3 and one capacitor Cnw is shown in FIG. 3.

The above-mentioned elements constituting one CC cell 10 is integrated, for example, over the semiconductive substrate 30 of the p-conductivity type. Speaking in more detail, an N+ type diffusion layer 32 and an N type shallow layer 34 are formed on the substrate 30 so as to define an N-channel region 36 between them. This shallow layer 34 is coupled with another N+ type diffusion layer 38. A P+ type diffusion layer 40 is further formed in the shallow layer 34. The P+ type diffusion layer 40 is electrically floating. A metal layer 42 is formed above the N-channel region 36 and the shallow N layer 34 to electrically insulate an oxide layer 44 from the substrate 30. The N-channel MOS FET Q1 is constituted by the above-mentioned N+layer 32, shallow N layer 34 and metal layer 42. On the other hand, the P-channel MOSFET Q2 is constituted by the region 36, P+ layer 40 and metal layer 42. Further, the N-channel JFET Q3 is constituted by the P+layer 40, shallow N layer 34 and substrate 30. Therefore, according to such a CC cell structure including three FETs, the metal layer 42 serves as the common gate electrode layer for the N-channel MOSFET Q1 and the P-channel MOSFET Q2. This metal layer 42 extends in the direction perpendicular to the surface of the sheet and serves as the gate electrode for other CC cells (not shown); therefore, the layer 42 functionally corresponds to the above-mentioned word line 14. A conductive wiring layer 46 is connected to the N+ diffusion layer 38 through a contact hole 48 formed in the insulative layer 44 to allow the wiring layer 46 to function as the bit line.

The capacitor Cnw is formed by: a PN junction capacitance between the P+ layer 40 and the shallow N layer 34. The reason why the relevant memory of the CC cell type can realize high memory density as compared with the publicly known dynamic RAM is because the substrate area for the capacitor included in the cell of the current readout type can be designed such that it is much smaller than the area of the capacitor included in the cell of the charge storage type. It should be noted that the substrate 30 is grounded and a positive fixed bias voltage $V+$is always supplied to the N+ layer 32. In addition, in the equivalent circuit configuration of the CC cell of FIG. 3, "Cg" designates a parasitic capacitance component which is parasitic on the gate electrode 42 of the P-channel MOSFET Q2. The CC cell structure itself described above is similar to that disclosed in K. Terada et al, "A New VLSI Memory Cell Using Capacitance Coupling," IDEM 82 Tech. Dig., 1982, pp 624 –627.

The operation of the VLSI semiconductor memory device with the CC cell structure according to one embodiment of the present invention with such an arrangement will now be described. It will be discussed the case where digital data of "1" or "0" is written in one arbitrary CC cell (for instance, as indicated by 10a in FIG. 1) in the data write operation mode. In this case, the address buffer 22 in FIG. 1 supplies the row address signal 20 to the bit select decoder 16 and the column address signal 24 to the word select decoder unit 18, respectively, in accordance with the select cell designating information which is supplied from the outside.

Figure 5:
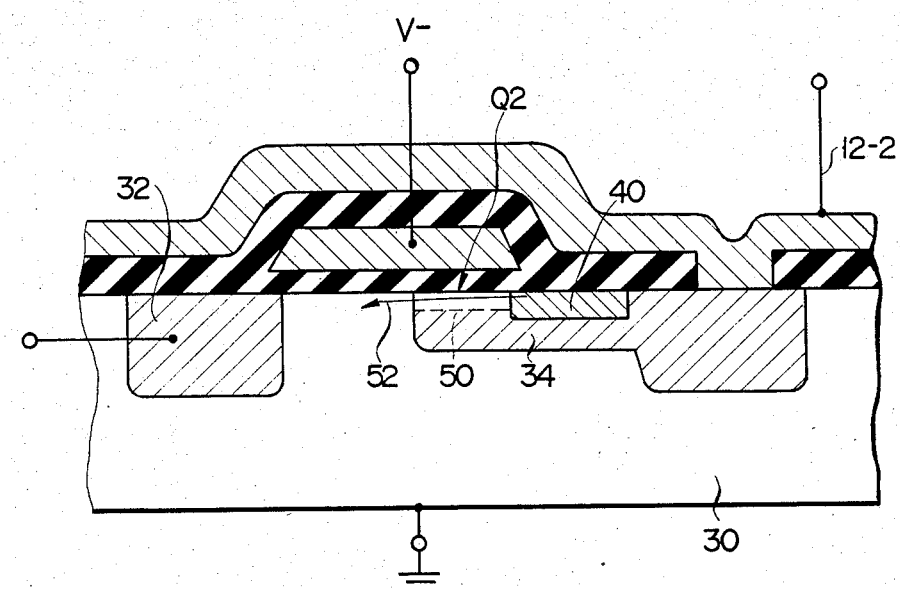
FIG. 5 is a diagram illustrating, as a model, the electrical operation (data clear of the P+layer) which is performed inside the selected CC cell in the data writing mode.

In response to the above row address signal 20, the word select decoder 18 applies a negative voltage V⁻ as shown by 48 in FIG. 4A to the one word line 14-1 connected to the selected cell 10a, and at the same time it sets the potentials of the other word lines 14-2 ... 14-N connected to the nonselected cells into the ground potential. Therefore, in the selected CC cell 10a, the potential of the gate electrode layer 42 in FIG. 2 becomes the negative voltage V⁻. When the potential of the gate electrode layer 42 of the selected CC cell 10a becomes the negative voltage V⁻, as illustrated by a broken line 50 in FIG. 5, the channel is opened in the shallow N-type layer 34 corresponding to the channel region of the P-channel MOSFET Q2. Thus, since the MOSFET Q2 is made conductive, the charges stored in the P+layer 40 are moved or released to the substrate 30 through this conductive MOSFET Q2 as shown by an arrow 52 in FIG. 5. In other words, the floating gate 40 of the selected CC cell 10a is cleared prior to the data writing.

At the same time, under control of the bit select decoder unit 16, the data voltage corresponding to the write data is supplied to the bit line 12-2 connected to the selected cell 10a (for example, the positive voltage V+ indicated by the potential line 54 in FIG. 4B is applied when the write data is digital data "1," while the zero volt indicated by the potential line 56 in FIG. 4B is applied when the write data is digital data "0," respectively). Therefore, as illustrated by a waveform line 58 in FIG. 4A, after the potential of the word line 14-1 of the selected cell 10a was returned to zero voltage, the data is written in the capacitor Cnw (see FIG. 3) which is formed by the N type layer 34 and the P+layer 40 as the floating gate of the bit line 12-2 connected to the selected CC cell 10a. When the write data is digital data "1," the potential of the electrically floating P+ layer 40 decreases to a negative voltage due to its coupling capacitance and the bit line layer 46. When the write data is digital data "0," the potential of the P+ layer 40 does not change. The digital information is stored by changing the charging state of the electrically floating P+ layer 40 in accordance with the manner mentioned above.

In the clearing operation of the P+ layer 40 of the data writing mentioned above, the negative voltage V⁻ is applied by the word select decoder 18 to the word line 14-1 connected to the selected CC cell 10a. Thus, it is quite impossible to avoid supplying negative voltage V⁻ to not only the selected CC cell 10a but also to the other nonselected CC cells. As a result of this, according to the same conventional semiconductor memory device, even when data is written in only a single selected cell, the data which has been preliminarily stored in the nonselected cells which commonly use the same word line as that of this selected cell will have been erased due to the above-mentioned clearing operation. To prevent this erasure, in the same conventional semiconductor memory device, when data is written in only a single selected cell, it is necessary that: (1) all data which have been preliminarily stored in the nonselected cells which commonly use the same word line as that of this selected cell be read out and temporarily stored in the external memory, and (2) after completion of the data writing in the selected cell, the same data is written again in the corresponding nonselected cells. This fact causes a major defect as the operating speed of the semiconductor memory device having high-memory density of this kind is made worse.

Such a problem can be easily and effectively solved in accordance with the concept of the present invention which will be explained hereinbelow. This is because according to the semiconductor memory device of the present invention, the above-mentioned data clearing operation in the nonselected cells which commonly use the same word line as that of the selected cell is automatically inhibited due to the operation of the bit select decoder unit 16.

In the selection of the bit line 12-2 connected to the selected CC cell 10a in response to the address signal 20 from the address buffer 22, the decoder unit 16 applies a high-voltage V++ (+10 volts in this embodiment) which is supplied from the voltage source 28 to the bit lines 12-1, 12-3 ... 12-N connected to the nonselected CC cells. Thus, as shown in FIG. 4C, the potentials of the bit lines 12-1, 12-3 ... 12-N connected to the nonselected CC cells 10b of one array are forcedly maintained at the high voltage V++ of this ten volts during the data writing operation in the selected cell. As a result of this, a large back gate bias is caused with respect to the bit lines 12-1, 12-3 ... 12-N of the nonselected CC cells 10b since the high-voltage V++ is applied thereto; therefore, the nonselected CC cells are forcedly maintained to be off (or inoperative). Namely, with regard to only the particular CC cell 10a in which the data is written among all of the CC cells connected to the word line 14-1 selected, the P-channel MOSFET Q2 is made conductive and the clearing operation is executed. On one hand, with respect to the remaining nonselected CC cells 10b connected to the word line 14-1 selected, the P-channel MOSFETs are rendered nonconductive and the charges stored in the P+ layer corresponding to these remaining nonselected CC cells 10b are kept therein during the data writing operation and are prevented from flowing out to the substrate 30. Therefore, it is possible to effectively prevent the data prestored in the P+ layer corresponding to these remaining nonselected CC cells 10b from being erased.

In order to selectively write with such a back gate bias effect, it is necessary that the electrical characteristic of the P-channel MOSFET Q2 satisfy certain conditions. Namely, it is necessary to set a threshold voltage Vth of the P-channel MOSFET Q2 (i) to be within a range of 0 to V+ volts when the positive voltage V+ for writing the selected bit lines is applied, and (ii) to be a negative voltage below the above-mentioned negative voltage V⁻ due to the back gate bias effect when the positive high-voltage V++ for the prevention of data erasure is applied to the nonselected bit lines.

The threshold voltage Vth of the P-channel MOSFET Q2 is represented as follows:

$$Vth = V_{FB} + 2\phi_F + \frac{\sqrt{2\epsilon qN(2\phi_F + V_B)}}{C_{OX}}$$

where,
$V_{FB}$: flat band voltage,
$\phi F$: Fermi level,
$\epsilon$: dielectric constant of semiconductive substrate 30,
N: impurity concentration of semiconductive substrate 30,
q: unit charge,
$V_B$: bias voltage to substrate 30,
$C_{OX}$: gate capacitance per unit area.

The practical discussion was made in accordance with the above expression. In order to increase the back gate bias effect of the P-channel MOSFET Q2, it is effective to increase the impurity concentration of the portion corresponding to the channel region (see FIG. 5, reference numeral 50) of this MOSFET Q2 of the shallow N type layer 34, and/or decrease the gate capacitance per unit area (for instance, increase the thickness of the gate insulating layer 44 in FIG. 2 or decrease the dielectric constant of the gate insulating layer 44 by adopting different materials). According to this embodiment, by adopting the above first method, the impurity concentration of the portion corresponding to the channel region (50 in FIG. 5) of the MOSFET Q2 of the shallow N type layer 34 can be set to a value on the order of $1 \times 10^{17}/cm^3$.

Therefore, according to the present invention, since the rewriting operation in association with the erasure of the data stored in the nonselected CC cells is not needed at all when the data is written, the data can be written in an arbitrary CC cell at a high speed. Further, the fact that the outflow of the data carriers in the nonselected CC cells is prevented denotes that the flow of an additional current in the data writing is not caused which enables the electric power consumption of the relevant VLSI semiconductor memory device to be minimized. Thus, it is possible to realize a VLSI memory of the next generation having the three excellent characteristics of high speed and low power consumption as well as a high memory density without needing a special manufacturing technology.

Next, the data read operation mode of the VLSI semiconductor memory device with the CC cell structure of the present invention will be additionally explained. In the data read operation mode, the case of performing the data reading with respect to the CC cell 10a to which the data was written in the manner as described above will now be discussed. In this case, the address buffer 22 of FIG. 1 respectively supplies the row address signal 20 to the bit select decoder 16 and supplies the column address signal 24 to the word select decoder unit 18 in accordance with the select cell designating information supplied from the outside.

Figure 6:
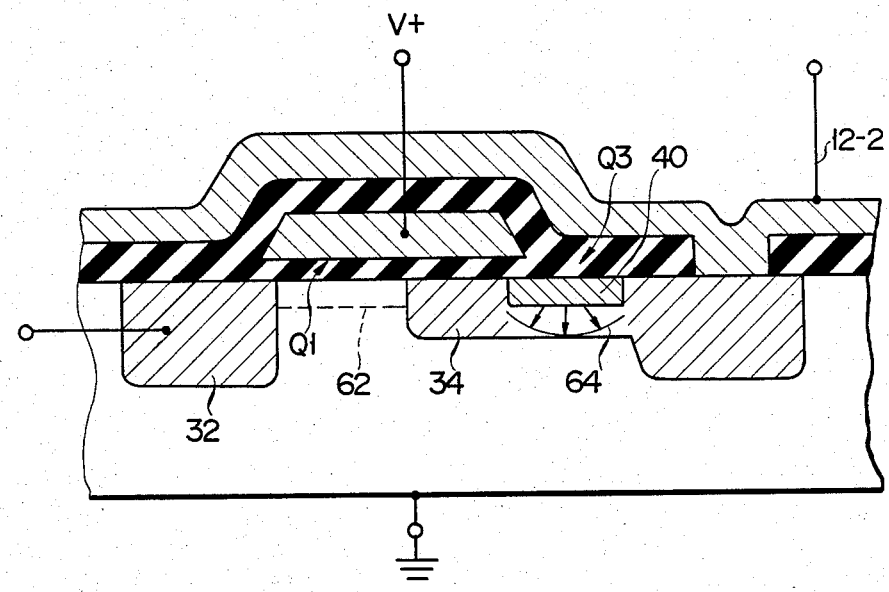
FIG. 6 is a diagram illustrating, as a model, the electrical operation with regard to the data readout which is performed inside the selected CC cell in the data reading mode.

In this data read operation mode, in response to the row address signal 20, the word select decoder 18 applies the positive voltage V+ as indicated by 60 in FIG. 4A to the one word line 14-1 connected to the selected cell 10a, and at the same time it sets the potentials of the other word lines 14-2, . . . 14-N connected to nonselected cells into the ground potential. By applying a positive voltage V+, the N-channel MOSFET Q1 of the selected CC cell is made conductive, thereby making the channel 62 open as schematically illustrated in FIG. 6. Therefore, the potential of the N+ layer 32 which functions as a source of the MOSFET Q1 appears in the N layer 34 serving as a drain through the N-channel 62. At this time, in the case where digital data "1" has been stored in the selected CC cell, the P+ layer 40 as a floating gate of this selected CC cell is charged at a negative voltage, so that the JFET Q3 is nearly nonconductive. This is because the depletion layer indicated by 64 in FIG. 6 is expanded just under the P+ layer 40 and the channel region of the JFET Q3 is depleted, so that the JFET Q3 is in the low-conductance state. Thus, the potential of the N+ layer 32 is difficult be transfer to the bit line 12-2. In other words, unless a predetermined voltage is developed in the bit line 12-2 connected to the selected CC cell 10a in the above-mentioned state, it can be confirmed that data "1" has been stored in this cell. The change in potential as mentioned above in the P+ layer 40 of the selected cell is indicated by a voltage waveform line 64 in FIG. 4D. During this interval, the potentials of the P+ layers of the nonselected CC cells are continuously maintained at a constant potential responsive to the storage data as shown in FIG. 4E.

On the contrary, if digital data "0" has been stored in the selected CC cell, the P+ layer 40 as a floating gate of this selected CC cell is not charged at a negative voltage, so that the JFET Q3 comes to a high-conductance state and is therefore conductive. Thus, the potential of the N+ layer 32 is easily transferred to the bit line 12-2 and appears in the bit line 12-2. Therefore, the potential of the bit line 12-2 increases as shown in a voltage waveform line 66 of the broken line in FIG. 4D. In other words, if a predetermined voltage is developed in the bit line 12-2 connected to the selected CC cell 10a in the above-mentioned state, it is possible to confirm that data "0" has been stored in this cell. In this way, the conductance of the JFET Q3 varies depending upon the charge of the P+ layer 40; and by detecting or sensing a difference in the amount of current which flows to the bit line 12-2 from the N+ layer 32 with a fixed bias, information can be effectively read out.

Although the present invention has been shown and described with reference to particular embodiments, various changes and modifications which are obvious to a person skilled in the art to which the invention pertains are deemed to lie within the spirit and scope of the invention.

For example, according to the foregoing embodiment, the P type substrate was adopted; the first MOSFET Q1 and junction FET Q3 were set to the N channel type; and the second MOSFET Q2 was set to the P channel type. However, the invention is not limited to this. An N type substrate may be employed and the conductive channel type of the above FETs may be set conversely. In such a case, it will be easily understood that the voltage which is applied by the bit select decoder unit 16 to the bit lines of the nonselected CC cells for prevention of the data erasure in the nonselected CC cells in data writing is opposite to the case of the foregoing embodiment.

What is claimed is:
1. A semiconductor memory device comprising:
(a) a semiconductive substrate;
(b) charge-coupling memory cells which are arranged in a matrix form on said substrate and are respectively connected to word lines and bit lines which cross substantially perpendicularly with each other, each of said charge-coupling memory cells having,
(b1) an electrically floating layer which changes its potential in accordance with digital data supplied from the corresponding bit line in the data writing mode,
(b2) a first field effect transistor having a source to which a first voltage at a fixed level is always supplied, a gate connected to the corresponding word line and a drain,
(b3) a second field effect transistor using said electrically floating layer as its drain, said second field effect transistor having a gate connected to the corresponding word line and a channel region whose impurity concentration is higher than that of said substrate,

(b4) a junction type field effect transistor which is connected with the drain of said first field effect transistor and the corresponding bit line, commonly uses said electrically floating layer as its gate and performs the switching operation in accordance with the data storage in said electrically floating layer in the data reading mode, thereby, when said junction type field effect transistor is made conductive, controlling the transmission of the first voltage to the corresponding bit line, and (b5) a capacitor formed by using said electrically floating layer and connected to said junction type field effect transistor; and (c) decoder means, formed on said substrate so as to be connected to the word lines and the bit lines, for, in the data writing mode, designating one selected cell to which data is written to write digital data which is supplied from the corresponding bit line into said selected cell, for supplying a second voltage to nonselected cells, which are connected to the same word line as that of said selected memory cell, through bit lines connected to said nonselected memory cells in such a manner as to forcedly cause second field effect transistors included in said nonselected cells to be nonconductive, and for preventing electrically floating layers included in said nonselected cells from coming into electrical contact with said substrate, whereby it is inhibited that the storage data in said nonselected cells is erased at the time of data writing of said selected cell.

2. The device according to claim 1, wherein said decoder means comprises:

(C1) a first decoder means which is formed over said substrate so as to be connected to said word lines connected to said charge-coupling memory cells and which, in the data writing mode, and which designates the one word line connected to the one selected cell to which data is written, and applies a third voltage such as to make the second field effect transistor included in said selected cell conductive, and allows the carriers corresponding to the data content of the electrically floating layer included in said selected cell to flow out to said substrate through said second conductive transistor, whereby after the data content of said electrically floating layer is cleared, digital data which is newly supplied from the corresponding bit line is stored in said selected cell; and (C2) a second decoder means which is formed over said substrate so as to be connected to said bit lines connected to said charge-coupling memory cells and which, in the data writing mode, applies the second voltage such as to forcedly make the second field effect transistors included in the nonselected cells connected to the same word line as that of said selected cell nonconductive, thereby preventing the data contents of the electrically floating layers included in said nonselected cells from being cleared.

3. The device according to claim 2, wherein said decoder means further comprises:

(C3) first voltage generator means, formed over said substrate so as to be connected to said second decoder means, for generating said second voltage and supplying it to said second decoder means.

4. The device according to claim 3, wherein said substrate and said electrically floating layer have the same conductivity type.

5. The device according to claim 4, wherein said substrate is grounded.

6. The device according to claim 4, wherein the gate of said first field effect transistor is made of a conductive layer insulatively provided over said substrate, said conductive layer being also used as a gate electrode of said second field effect transistor.

7. A semiconductor memory device of the current readout type comprising:

(a) a semiconductive substrate having a first conductivity type;

(b) charge-coupling memory cells which are arranged like a matrix over said substrate and are respectively connected to word lines and bit lines which cross substantially perpendicularly with each other, each of said charge-coupling memory cells having, (b1) electrically floating layer which capacitively stores digital data supplied from the corresponding bit line in the data writing mode, (b2) a first field effect transistor of a second channel conductivity type having a source to which a first voltage at its fixed level is always applied, a gate connected to the corresponding word line and a drain (b3) a second field effect transistor of the first channel conductivity type which commonly uses said electrically floating layer as its drain, said second field effect transistor having a gate connected to the corresponding word line and a channel region whose impurity concentration is higher than that of said substrate, (b4) a junction type field effect transistor of the first channel conductivity type which is connected with the drain of said first field effect transistor and the corresponding bit line, commonly uses said electrically floating layer as its gate and performs the switching operation in accordance with the data storage in said electrically floating layer in the data reading mode, thereby, when it is made conductive, transmitting said first voltage of said first field effect transistor to the corresponding bit line, and (b5) a capacitor formed by said electrically floating layer and connected to said junction type field effect transistor; and (c) first decoder means, formed on said substrate so as to be connected to said word lines, for, in the data writing mode, designating one word line which is connected to one selected cell to which data is written and for applying a second voltage such as to make the first field effect transistor included in said selected cell conductive and for allowing the carriers corresponding to the data content of the electrically floating layer included in said selected cell to flow out to said substrate through said second conductive transistor, whereby after the data content of said electrically floating layer is cleared, digital data which is newly supplied from said corresponding bit line is stored in said selected cell; and (d) a second decoder means which is formed over said substrate so as to be connected to said bit lines and which, in the data writing mode, applies a third voltage so as to forcibly make second field effect transistors included in the nonselected cells connect to the same word line as that of said selected nonconductive cell, thereby preventing the data contents of the electrically floating layers included in said nonselected cells from being cleared.

8. The device according to claim 1, wherein the impurity concentration of the channel region of said second field effect transistor is higher than that of said substrate by at least one order of magnitude, thereby, when the second voltage is applied to the nonselected memory cells, enforcing such a back gate bias effect as to make said second field effect transistors included in said nonselected cells nonconductive.

9. The device according to claim 8, wherein the impurity concentration of the channel region of said second field effect transistor is set to a value on the order of $1 \times 10^{17}$/cm.

* * * * *